United States Patent
Watanabe et al.

(10) Patent No.: US 9,786,833 B2
(45) Date of Patent: Oct. 10, 2017

(54) PIEZOELECTRIC CERAMIC, METHOD OF MANUFACTURING SAME, AND PIEZOELECTRIC CERAMIC SPEAKER USING SAME

(71) Applicant: TAIYO YUDEN CO., LTD., Taito-ku, Tokyo (JP)

(72) Inventors: Gouki Watanabe, Takasaki (JP); Takayuki Goto, Takasaki (JP); Keiichi Hatano, Takasaki (JP); Sumiaki Kishimoto, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 151 days.

(21) Appl. No.: 14/522,280

(22) Filed: Oct. 23, 2014

(65) Prior Publication Data

US 2015/0132529 A1    May 14, 2015

(30) Foreign Application Priority Data

Nov. 8, 2013 (JP) .................. 2013-232588
Jun. 10, 2014 (JP) .................. 2014-119824

(51) Int. Cl.
| | |
|---|---|
| *H01L 41/187* | (2006.01) |
| *H01L 41/43* | (2013.01) |
| *C04B 35/493* | (2006.01) |
| *C04B 35/64* | (2006.01) |
| *H04R 17/00* | (2006.01) |

(Continued)

(52) U.S. Cl.
CPC ........ *H01L 41/1876* (2013.01); *C04B 35/493* (2013.01); *C04B 35/6261* (2013.01); *C04B 35/62645* (2013.01); *C04B 35/64* (2013.01); *H01L 41/43* (2013.01); *H04R 17/00* (2013.01); *H04R 31/00* (2013.01); *C04B 2235/3244* (2013.01); *C04B 2235/3251* (2013.01); *C04B 2235/3255* (2013.01); *C04B 2235/3279* (2013.01); *C04B 2235/3284* (2013.01); *C04B 2235/768* (2013.01); *C04B 2235/786* (2013.01);

(Continued)

(58) Field of Classification Search
CPC .................. H01L 41/1876; C04B 35/622
USPC ................................................ 428/76
See application file for complete search history.

(56) References Cited

U.S. PATENT DOCUMENTS

2007/0252483 A1    11/2007    Yamamoto et al.

FOREIGN PATENT DOCUMENTS

| CN | 102531638 A | 7/2012 |
|---|---|---|
| JP | 2003-238248 A | 8/2003 |

(Continued)

OTHER PUBLICATIONS

A First Office Action issued by the State Intellectual Property Office of China, mailed Apr. 6, 2016, for Chinese counterpart application No. 201410573511.2.

*Primary Examiner* — Brent O'Hern
(74) *Attorney, Agent, or Firm* — Law Office of Katsuhiro Arai

(57) ABSTRACT

A piezoelectric ceramic has a primary phase constituted by ceramic grains of perovskite crystal structure containing Pb, Nb, Zn, Ti, and Zr, and a secondary phase constituted by ZnO grains present sporadically in the primary phase. The piezoelectric ceramic of high kr and high specific dielectric constant can be sintered at low temperature and exhibit minimal characteristics variations.

7 Claims, 1 Drawing Sheet

(51) Int. Cl.
*H04R 31/00* (2006.01)
*C04B 35/626* (2006.01)

(52) U.S. Cl.
CPC ....... *C04B 2235/80* (2013.01); *Y10T 428/239* (2015.01)

(56) References Cited

FOREIGN PATENT DOCUMENTS

| | | | |
|---|---|---|---|
| JP | 2006193413 A | * | 7/2006 |
| WO | 2006/075449 A1 | | 7/2006 |

* cited by examiner

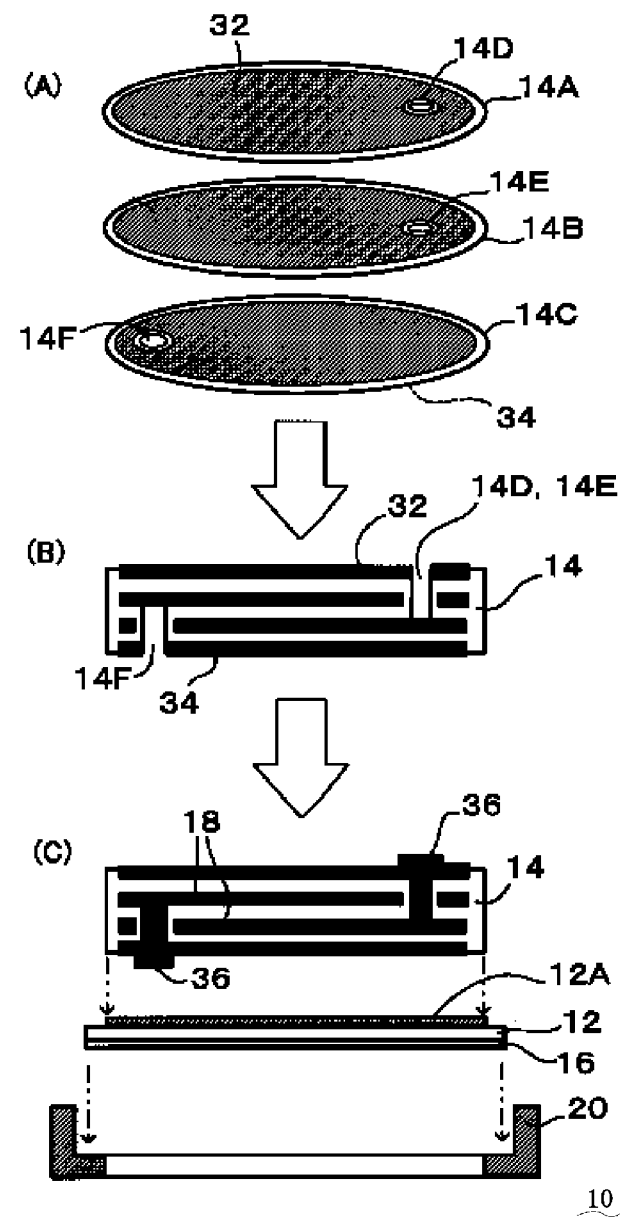

PIEZOELECTRIC CERAMIC, METHOD OF MANUFACTURING SAME, AND PIEZOELECTRIC CERAMIC SPEAKER USING SAME

FIELD OF THE INVENTION

The present invention relates to a piezoelectric ceramic, method of manufacturing a piezoelectric ceramic, and a piezoelectric ceramic speaker using a piezoelectric ceramic.

1. Description of the Related Art

Piezoelectric ceramics with a function to convert electrical energy to mechanical energy or mechanical energy to electrical energy (piezoelectric effect) have been applied to a number of electronic devices.

Piezoelectric porcelain compositions having lead zirconate titanate ($Pb(Ti,Zr)O_3$, hereinafter referred to as "PZT") as their primary component have excellent piezoelectric characteristics near the morphotropic phase boundary (MPB). Accordingly, PZTs are widely used as materials for acoustic elements, piezoelectric actuators, and other piezoelectric devices.

The characteristics required of piezoelectric porcelain compositions for piezoelectric devices include high kr, a low Young's modulus, a certain level of electrical resistance, and a high Curie temperature, etc., depending on the purpose of use of the piezoelectric device being the final product. Various types of piezoelectric porcelain compositions that satisfy these characteristics have been proposed.

To improve the characteristics of PZT piezoelectric porcelain compositions, Patent Literatures 1 and 2 describe processes of dissolving $Pb(Ni_{1/3}Nb_{2/3})O_3$ (hereinafter referred to as "PNN"), $Pb(Zn_{1/3}Nb_{2/3})O_3$ (hereinafter referred to as "PZN"), etc., in PZT, thereby substituting the B site components, namely Ti and Zr, with other atoms. For example, Patent Literature 1 describes a process of not only substituting the A site component Pb of the four-component complex oxide PNN—PZN—PZ-PT with Ca, Sr, Ba, or other element, but also adding acceptor elements (Ni, Zn) of smaller valence than Ti and Zr, by specified mol numbers higher than their mol numbers in the stoichiometric composition, thereby rendering the B site components "acceptor-excessive," while keeping the content of each other component within a specified range of mol ratios, in order to make low-temperature sintering feasible. Patent Literature 2 discloses a specific piezoelectric porcelain composition constituted by a perovskite composition and $Ag_2O$ contained in the perovskite composition, where such piezoelectric porcelain composition is characterized as sinterable at low temperatures of 900° C. or below, while having a small ceramic grain size and offering high mechanical strength.

2. Background Art Literatures

[Patent Literature 1] International Patent Laid-open No. WO/2006/075449

[Patent Literature 2] Japanese Patent Laid-open No. 2003-238248

SUMMARY

An object of the present invention is to provide a piezoelectric ceramic of high kr and high specific dielectric constant that can be sintered at low temperature, offer high characteristics, and exhibit minimal characteristics variations.

The piezoelectric ceramic proposed by the present invention has a primary phase constituted by ceramic grains of perovskite crystal structure containing Pb, Nb, Zn, Ti, and Zr, and a secondary phase constituted by ZnO grains sporadically present in the primary phase.

Preferably the primary phase is constituted by ceramic grains of the composition $Pb\{(Zr_{(1-a)}Ti_a)_x \cdot (Ni_{1/3}Nb_{2/3})_y \cdot (Zn_{1/3}Nb_{2/3})_z\}O_3$ (where $0<x\leq0.85$, $0\leq y<1$, $0<z<1$, $x+y+z=1$, and $0.45\leq a\leq0.60$) and, more preferably x and y as mentioned above are in the ranges of $0<x<0.75$ and $0<y<1$, respectively. Even more preferably the size of the ZnO grains constituting the secondary phase is in the range of 0.4 to 1.6 μm.

As a favorable method of manufacturing a piezoelectric ceramic proposed by the present invention, a manufacturing method is provided that has a step to obtain a composition constituted by ceramic grains of perovskite crystal structure expressed by $Pb\{(Zr_{(1-a)}Ti_a)_x \cdot (Ni_{1/3}Nb_{2/3})_y \cdot (Zn_{1/3}Nb_{2/3})_z\}O_3$ (where $0<x\leq0.75$, $0\leq y<1$, $0<z<1$, $x+y+z=1$, and $0.45\leq a\leq0.60$) and a step to mix the obtained composition with ZnO grains and then compact and sinter the mixture. In the aforementioned manufacturing method, preferably $0<x<0.75$, and $0<y<1$.

According to the present invention, a piezoelectric ceramic speaker equipped with an acoustic element that in turn has the aforementioned piezoelectric ceramic is also provided.

According to the present invention, a piezoelectric ceramic is provided that can be sintered at 900° C. or below, while achieving high kr, high specific dielectric constant, and low characteristics variations at the same time. By using this piezoelectric ceramic, a high-performance speaker is expected to be realized.

Any discussion of problems and solutions involved in the related art has been included in this disclosure solely for the purposes of providing a context for the present invention, and should not be taken as an admission that any or all of the discussion were known at the time the invention was made.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

FIG. 1 consists of (A) a drawing showing laminate sheets, (B) a drawing showing stacked laminate sheets, and (C) a drawing showing a piezoelectric ceramic speaker using the stacked laminate sheets, explaining how a piezoelectric ceramic speaker is manufactured.

| [Description of the Symbols] | |
|---|---|
| 10. Piezoelectric sound-generating element | 12. Vibration plate |
| 12A. Adhesive | 14. Drive plate |
| 14A to 14C. Laminate sheet | 14D to 14F. Through hole |
| 16. Vibration suppressing material | 20. Enclosure |
| 32, 34. Electrode | 36. Through hole conductor |

DETAILED DESCRIPTION OF EMBODIMENTS

The piezoelectric ceramic proposed by the present invention has a primary phase and a secondary phase.

The ceramic grains constituting the primary phase have a perovskite crystal structure that contains all of Pb, Nb, Zn, Ti, and Zr, and preferably further contains Ni. The piezoelectric ceramic proposed by the present invention is mainly dominated by the primary phase, with the secondary phase present sporadically in the primary phase. The secondary phase is constituted by ZnO grains.

Preferably the primary phase is constituted by ceramic grains of the composition $Pb\{(Zr_{(1-a)}Ti_a)_x \cdot (Ni_{1/3}Nb_{2/3})_y \cdot (Zn_{1/3}Nb_{2/3})_z\}O_3$. Here, $0<x<0.85$, $0\leq y<1$, $0<z<1$, $x+y+z=1$, and $0.45 \leq a \leq 0.60$. More preferably x and y are in the ranges of $0<x<0.75$ and $0<y<1$, respectively. By keeping x to 0.85 or less, or preferably less than 0.75, the sintering temperature can be lowered. By keeping x and z in the aforementioned ranges, it becomes possible to adjust the piezoelectric characteristics and Curie temperature easily by selecting an appropriate value of a. By keeping the value of a in the aforementioned range, the piezoelectric constant can be increased.

The chemical composition of the ceramic grains constituting the primary phase can be measured using the energy-dispersive X-ray spectroscopy method. In the ceramic system proposed by the present invention, the composition of ceramic grains can be adjusted by adjusting the materials.

The secondary phase is sporadically present randomly in the primary phase constituted by or consisting essentially of ceramic grains of perovskite crystal structure, and the secondary phase is constituted by or consists essentially of ZnO grains in some embodiments. Presence of the secondary phase makes the structure extremely low in energy and stable. That means that the structure becomes stable even with the application of lower thermal energy. In other words, the secondary phase has the effect of promoting sintering. It also permits strong bonding at the grain boundary, which is expected to increase the strength of the bulk sintered compact. These effects make it possible to obtain a more stable ceramic of good bulk density and sinter it at low temperature.

The size of the ZnO grains constituting the secondary phase is preferably in the range of 0.4 to 1.6 μm. The ZnO grain size can be calculated by obtaining, by means of image analysis, the diameters of 100 or more ZnO grains observed on a SEM (Scanning Electron Microscope) image of a section of the piezoelectric ceramic, and then averaging these diameters (average grain size).

The piezoelectric ceramic proposed by the present invention can be manufactured by using any known conventional method of manufacturing piezoelectric ceramic as deemed appropriate. Examples include, but are not limited to, a manufacturing method that has a step to obtain a composition constituted by ceramic grains of perovskite crystal structure expressed by $Pb\{(Zr_{(1-a)}Ti_a)_x \cdot (Ni_{1/3}Nb_{2/3})_y \cdot (Zn_{1/3}Nb_{2/3})_z\}O_3$ and a step to mix the obtained composition with ZnO grains and then compact and sinter the mixture. Here, as mentioned above, $0<x\leq 0.85$, $0\leq y<1$, $0<z<1$, $x+y+z=1$, and $0.45\leq a\leq 0.60$, where, more preferably x and y are in the ranges of $0<x<0.75$ and $0<y<1$, respectively.

For the step to obtain a composition constituted by ceramic grains of perovskite crystal structure, any known conventional method of manufacturing piezoelectric ceramic can be referenced as deemed appropriate. Examples include wet-mixing the material metals, such as PbO, $ZrO_2$, $TiO_2$, NiO, ZnO, and $Nb_2O_5$ powders, and then drying the obtained suspension liquid and sintering the dried mixture in an electric furnace in atmosphere at a temperature of preferably 900° C. or below, for example. This process causes the metal oxides in the mixture to undergo solid-phase reaction to form a perovskite compound. Specific examples of each process are given in the examples below.

By wet-crushing and mixing the obtained perovskite compound with the secondary phase material ZnO grains and then drying the mixture, a complete powder (powder before sintering) can be obtained. By mixing an organic binder into this complete powder as necessary and then compacting or otherwise forming the mixture into a specified shape, followed by sintering, a piezoelectric ceramic can be obtained. The sintering ambience is not limited in any way, but preferably sintering is performed in atmosphere. Preferably the sintering temperature is 850 to 900° C. A conductive paste containing Ag, etc., can be printed onto the sintered piezoelectric ceramic.

Under the present invention, a piezoelectric ceramic speaker using the aforementioned piezoelectric ceramic is also provided. Preferably the piezoelectric ceramic is used as a component of an acoustic element. For example, a piezoelectric ceramic laminate can be polarized by impressing it with direct-current voltage through the electrode terminals connected to both sides of the laminate, in order to obtain a piezoelectric drive plate that is then bonded with a vibration plate. The vibration plate can have a vibration-suppressing material formed on it. An acoustic element can be obtained this way, and any known conventional method can be referenced, as deemed appropriate, to obtain a speaker, as the final product, from this acoustic element. Specific manufacturing examples are described in the section [Examples] below.

EXAMPLES

The present invention is explained more specifically below using examples. It should be noted, however, that the present invention is not limited to the embodiments described in [Examples].

Examples 1, 2, and Comparative Example 1

First, material powders of PbO, $ZrO_2$, $TiO_2$, NiO, ZnO, and $Nb_2O_5$ were prepared and weighed separately and then introduced to a pot mill together with zirconia beads and ion exchange water, after which the materials were wet-mixed for 16 hours and the obtained slurry was transferred to a vat, and the vat was placed in a dryer and dried at 150° C. The amounts of materials introduced reflected the abundance ratios of the respective metals in the ceramic grain of the composition $Pb\{(Zr_{(1-a)}Ti_a)_x \cdot (Ni_{1/3}Nb_{2/3})_y \cdot (Zn_{1/3}Nb_{2/3})_z\}O_3$, where a=0.548, x=0.636, y=0.14 and z=0.224.

Next, the dried mixture was sintered for 3 hours at 830° C. in atmosphere using an electric furnace. This sintering caused the metal oxides in the mixture to react with one another through solid-phase reaction and formed a perovskite compound. This corresponds to the primary phase.

Next, the perovskite compound, and ZnO grains of specified grain size corresponding to the secondary phase in the case of Example 1 or 2, were introduced to a pot mill together with zirconia beads and ion exchange water, and wet-crushed for 16 hours, after which the obtained suspension liquid was transferred to a vat, and the vat was placed in a dryer and dried at 150° C. to obtain a complete powder. The amount of ZnO, or the material of the secondary phase, was adjusted to 0.2 to 0.25 parts by weight per 100 parts by weight of the perovskite compound. In Comparative Example 1, the aforementioned operation was performed without adding ZnO grains. Next, a small amount of organic binder was mixed into the complete powder and the powder was compacted with a pressure of 1.5 MPa using a press, to obtain a disk-shaped sample of 8 mm in diameter and 0.5 mm in thickness. Next, the sample was placed in an electric furnace and sintered for 2 hours at 900° C. in atmosphere, after which the sample was removed from the electric furnace and printed with a frit-less Ag paste on both sides and then baked at 870° C. in atmosphere to form external electrodes.

Next, the sample with external electrodes was polarized by impressing it with a voltage of 2.0 kV/mm for 15 minutes at 150° C. Next, the polarized sample was measured for specific dielectric constant, and also measured for impedance according to the applicable standard of the Japan Electronics and Information Technology Industries Association (JEITA EM-4501), to calculate the piezoelectric characteristic kr.

Example 3, Comparative Example 2

A sample for Example 3 was manufactured with ZnO grains added for the secondary phase, and a sample for Comparative Example 2 was manufactured without adding such grains, in the same manner as explained above except that the composition of the perovskite compound in the primary phase was changed to $Pb\{(Zr_{(1-a)}Ti_a)_x \cdot (Ni_{1/3}Nb_{2/3})_y \cdot (Zn_{1/3}Nb_{2/3})_z\}O_3$ (where a=0.49, x=0.8, y=0, z=0.2) (accordingly, NiO was not used), and the samples were polarized and their piezoelectric characteristics were calculated as mentioned above.

When sections of the samples were observed, the primary phase and secondary phase were found in the case of Examples 1, 2, and 3, while no equivalent of the secondary phase was found in the case of Comparative Examples 1 and 2. Chemical analysis of primary phase and secondary phase confirmed that the additive ratios of material powders were directly reflected in each ceramic composition.

In Examples 1, 2, and 3, 100 areas of secondary phase were randomly selected and identified and their diameters were measured on the image and then averaged to calculate the ZnO grain size.

The results of the aforementioned measurements/evaluations are shown below.

| | ZnO size (μm) | kr (%) | specific dielectric constant ($\epsilon_{33}{}^T/\epsilon_0$) |
|---|---|---|---|
| Comparative Example 1 | 0 | 66.7 | 3114 |
| Comparative Example 2 | 0 | 68.0 | 1831 |
| Example 1 | 0.4 | 68.0 | 3283 |
| Example 2 | 1.6 | 67.8 | 3271 |
| Example 3 | 0.9 | 69.1 | 1992 |

Sound pressure is determined by the relationship of kr and specific dielectric constant.

To be specific, a specified sound pressure can be ensured when the kr is 69 or greater and specific dielectric constant is 1900 or greater. Or, a specified sound pressure can be ensured when the kr is 67 or greater and specific dielectric constant is 3000 or greater.

According to the examples presented herein, the specific dielectric constant increased when Ni was contained, while the kr increased when Ni was not contained.

Five piezoelectric ceramic speakers were manufactured using each of piezoelectric ceramics identical to those in Examples 2 and 3 and Comparative Examples 1 and 2 above, and evaluated. FIG. 1 is a drawing that explains how a piezoelectric ceramic speaker is manufactured. First, a laminate that would become a drive plate 14 is explained. A slurry was prepared by adding a binder to the aforementioned complete powder, and green sheets were obtained from this slurry using the doctor blade method or other method. The green sheets thus obtained were cut and screen-printed with an Ag paste (electrodes 32, 34) to form laminate sheets 14A to 14C as shown in FIG. 1(A). In addition, through holes 14D to 14F were formed at specified positions. Thereafter, the laminate sheets 14A to 14C were stacked and pressure-bonded, as shown in FIG. 1(B). Then, the Ag paste was filled in the through holes (through hole conductors 36), as shown in FIG. 1(C). Thereafter, the stack was cut to a specified shape and sintered at a temperature of 900° C., to obtain a laminate of 15 mm in outer diameter and 60 μm in thickness (20 μm×3 layers).

The laminate was polarized by impressing it with a direct-current voltage through the electrode terminals connected to both sides of the laminate, to obtain a piezoelectric drive plate. The obtained drive plate 14 was then bonded to a vibration plate 12 having a vibration-suppressing material 16 formed on it, as shown in FIG. 1(C). The vibration plate 12 and drive plate 14 were bonded by uniformly screen-printing an adhesive 12A over the main side of the vibration plate 12 and then attaching the drive plate 14 to it. At this time, a conductive adhesive was used for this adhesive 12 A. By obtaining an acoustic element 10 this way and then assembling the element into an enclosure 20, a piezoelectric ceramic speaker was obtained.

The obtained piezoelectric ceramic speaker was evaluated for electromechanical coupling constant k31 (%), piezoelectric strain constant d31 (%) and average sound pressure (dB) at 800, 1000, 1500 and 2000 Hz. The five-sample average of average sound pressure reflects the level of piezoelectric ceramic speaker characteristics, while the five-sample deviation of average sound pressure reflects the level of characteristics variation.

The results of the above evaluations are summarized in the tables below (five samples each). Table 1 shows the results of Example 2.

TABLE 1

| k31 | d31 | Average sound pressure (dB) |
|---|---|---|
| 40.3% | 262.0 | 93.4 |
| 39.8% | 264.0 | 93.5 |
| 40.2% | 275.0 | 93.8 |

TABLE 1-continued

| k31 | d31 | Average sound pressure (dB) | |
|---|---|---|---|
| 40.3% | 262.9 | | 93.4 |
| 39.9% | 260.3 | | 93.3 |
| | | Average | 93.5 |
| | | Deviation | 0.2 |

Table 2 shows the results of Comparative Example 1.

TABLE 2

| k31 | d31 | Average sound pressure (dB) | |
|---|---|---|---|
| 39.4% | 251.2 | | 93.0 |
| 37.6% | 252.6 | | 93.1 |
| 37.5% | 245.5 | | 92.8 |
| 35.4% | 241.8 | | 92.7 |
| 40.0% | 274.9 | | 93.8 |
| | | Average | 93.1 |
| | | Deviation | 0.4 |

Table 3 shows the results of Example 3.

TABLE 3

| k31 | d31 | Average sound pressure (dB) | |
|---|---|---|---|
| 41.0% | 210.1 | | 91.4 |
| 41.4% | 209.2 | | 91.3 |
| 41.6% | 210.1 | | 91.4 |
| 42.1% | 218.8 | | 91.7 |
| 41.2% | 214.5 | | 91.5 |
| | | Average | 91.5 |
| | | Deviation | 0.2 |

Table 4 shows the results of Comparative Example 2.

TABLE 4

| k31 | d31 | Average sound pressure (dB) | |
|---|---|---|---|
| 38.8% | 187.3 | | 90.4 |
| 41.8% | 211.9 | | 91.4 |
| 38.4% | 186.5 | | 90.3 |
| 38.4% | 184.2 | | 90.2 |
| 40.5% | 197.0 | | 90.8 |
| | | Average | 90.6 |
| | | Deviation | 0.5 |

Compared to Comparative Example 1, Example 2 resulted in greater values of k31 and d31 in general, with greater average sound pressures and smaller average sound pressure deviation (corresponding to characteristics variation). The same is true with Example 3 when compared to Comparative Example 2.

According to the present invention, the piezoelectric speaker characteristics are expected to improve and characteristics variation decrease, resulting in further quality improvement of the acoustic product, etc.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. The terms "constituted by" and "having" refer independently to "typically or broadly comprising", "comprising", "consisting essentially of", or "consisting of" in some embodiments. In this disclosure, any defined meanings do not necessarily exclude ordinary and customary meanings in some embodiments.

The present application claims priorities to Japanese Patent Applications No. 2013-232588, filed Nov. 8, 2013, and No. 2014-119824, filed Jun. 10, 2014, each disclosure of which is incorporated herein by reference in its entirety (including any and all particular combinations of the features disclosed therein) for some embodiments.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A piezoelectric ceramic having a primary phase constituted by ceramic grains of perovskite crystal structure containing Pb, Nb, Zn, Ti, and Zr, and a secondary phase constituted by ZnO grains, wherein the primary phase is constituted by ceramic grains expressed by a composition formula $Pb\{(Zr_{(1-a)}Ti_a)_x \cdot (Ni_{1/3}Nb_{2/3})_y \cdot (Zn_{1/3}Nb_{2/3})_z\}O_3$ (where $0 < x \leq 0.85$, $0 \leq y < 1$, $0 < z < 1$, $x+y+z=1$, and $0.45 \leq a \leq 0.60$).

2. A piezoelectric ceramic according to claim 1, wherein the secondary phase is sporadically present randomly in the primary phase consisting essentially of the ceramic grains of perovskite crystal structure, and the secondary phase consists essentially of ZnO.

3. A piezoelectric ceramic according to claim 1, wherein an average size of the ZnO grains is 0.4 to 1.6 µm.

4. A piezoelectric ceramic according to claim 1, wherein the secondary phase accounts for about 0.2 to about 0.25 parts by weight relative to 100 parts by weight of the primary phase.

5. A piezoelectric ceramic according to claim 1, wherein x and y as mentioned above are in ranges of $0 < x < 0.75$ and $0 < y < 1$.

6. A method of manufacturing piezoelectric ceramic having a primary phase constituted by ceramic grains of perovskite crystal structure containing Pb, Nb, Zn, Ti, and Zr, and a secondary phase constituted by ZnO grains, wherein the primary phase is constituted by ceramic grains expressed by a composition formula $Pb\{(Zr_{(1-a)}Ti_a)_x \cdot (Ni_{1/3}Nb_{2/3})_y \cdot (Zn_{1/3}Nb_{2/3})_z\}O_3$ (where $0 < x \leq 0.85$, $0 \leq y < 1$, $0 < z < 1$, $x+y+z=1$, and $0.45 \leq a \leq 0.60$), said method comprising:

a step to obtain a composition constituted by ceramic grains of perovskite crystal structure expressed by formula $Pb\{(Zr_{(1-a)}Ti_a)_x \cdot (Ni_{1/3}Nb_{2/3})_y \cdot (Zn_{1/3}Nb_{2/3})_z\}O_3$ (where $0 < x \leq 0.85$, $0 \leq y < 1$, $0 < z < 1$, $x+y+z=1$, and $0.45 \leq a \leq 0.60$); and a step to mix the obtained composition with ZnO grains and then compact and sinter the mixture.

7. A manufacturing method according to claim 6, wherein x and y as mentioned above are in ranges of $0 < x < 0.75$ and $0 < y < 1$.

* * * * *